United States Patent [19]

Pattany et al.

[11] Patent Number: 4,728,890
[45] Date of Patent: Mar. 1, 1988

[54] MOTION ARTIFACT SUPPRESSION TECHNIQUE OF MAGNETIC RESONANCE IMAGING

[75] Inventors: Pradip M. Pattany, Willoughby Hills; James E. McNally, Chagrin Falls, both of Ohio

[73] Assignee: Picker International, Inc., Highland Heights, Ohio

[21] Appl. No.: 879,596

[22] Filed: Jun. 27, 1986

Related U.S. Application Data

[63] Continuation-in-part of Ser. No. 766,757, Aug. 16, 1985, Pat. No. 4,683,431.

[51] Int. Cl.$^4$ ............................................. G01R 33/20
[52] U.S. Cl. .................................... 324/309; 324/312; 128/653
[58] Field of Search ............... 324/307, 309, 310, 311, 324/312; 128/653

[56] References Cited

U.S. PATENT DOCUMENTS

| 4,516,075 | 5/1985 | Moran | 324/309 |
| 4,549,139 | 10/1985 | MacFall | 324/309 |
| 4,549,140 | 10/1985 | MacFall | 324/309 |
| 4,564,017 | 1/1986 | Glover | 128/653 |
| 4,567,893 | 2/1986 | Charles | 128/653 |
| 4,581,581 | 4/1986 | Pelc | 324/309 |
| 4,616,180 | 10/1986 | Compton | 324/309 |

FOREIGN PATENT DOCUMENTS

2161275  1/1986  United Kingdom .

Primary Examiner—Stewart J. Levy
Assistant Examiner—Kevin D. O'Shea
Attorney, Agent, or Firm—Fay, Sharpe, Beall, Fagan, Minnich & McKee

[57] ABSTRACT

A pulse sequencer (40) controls a resonance excitation controls circuit (22), an inversion pulse controls circuit (24), a slice select gradient controls circuit (32), a read gradient controls circuit (34), and a phase encode gradient controls circuit (36) to cause an appropriate gradient pulse imaging sequence to be generated in the image region. The operator selects an appropriate imaging sequence such as a spin echo, inversion recovery, multi-echo, radient echo, or other conventional imaging sequence and the parameters, such as the number of repetitions, from an image pulse sequence and motion desensitization memory (44, 46). In the exemplary pulse sequences of FIGS. 2-4, this memory directs the formation of RF pulses (62, 66), slice selection pulses (60, 64) and read gradient pulse (70), phase encode gradient pulse (72), and the appropriate additional gradient pulses for rephasing signals from one or more of static, constant velocity, accelerating, and pulsatilitory tissue in the image region. By rephasing the magnetic resonance signal components from tissue moving with the selected motion characteristics such that the corresponding moments in time are set equal to zero, motion artifacts from moving tissue are suppressed.

16 Claims, 4 Drawing Figures

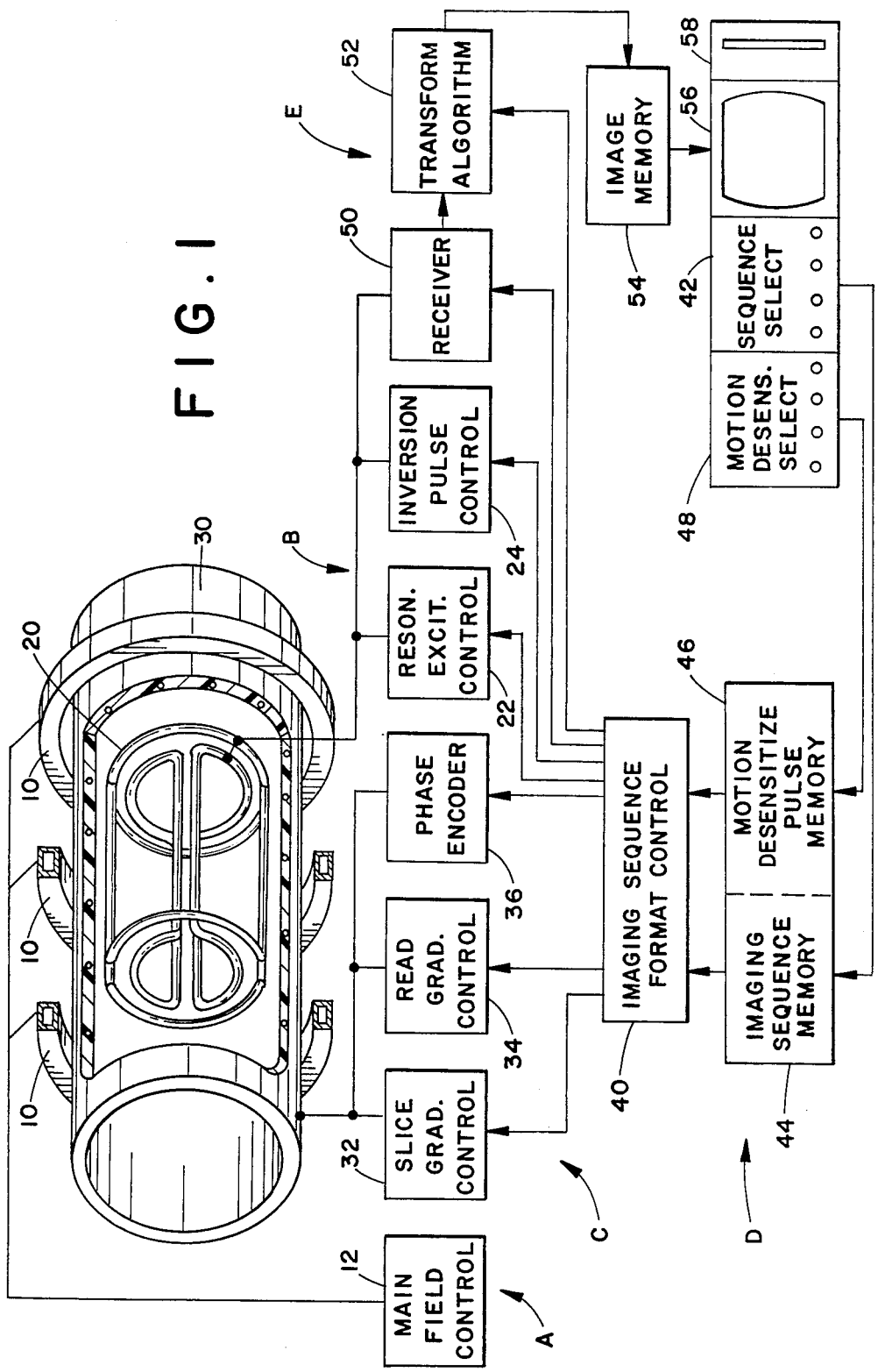

MOTION ARTIFACT SUPPRESSION TECHNIQUE OF MAGNETIC RESONANCE IMAGING

The present application is a continuation-in-part of U.S. application Ser. No. 766,757 filed on Aug. 16, 1985 now U.S. Pat. No. 4,683,431.

BACKGROUND OF THE INVENTION

The present invention relates to the art of magnetic resonance imaging. It finds particular application in conjunction with imaging body tissue in regions which contain moving tissues, organs, or the like and will be described with particular reference thereto. However, it is to be appreciated that the present invention is also applicable to improving the clarity and freedom of artifacts in imaging sequences in which the desensitization or freezing of motion-related data is advantageous.

The human body undergoes at least four types of motion in areas which are commonly the subject of a magnetic resonance image. These motions include (1) blood flow, (2) respiratory and cardiac movement, (3) involuntary movement (e.g. the orbits of the eyes), and (4) peristalitic motion (e.g. arythmic motion of the esophagus and abdominal region). Commonly, a series of views, e.g. 256 views, is collected to form each image, with each view being displaced in time from the others. It was heretofore believed that motion-related artifacts were attributable to the inconsistency in the position of the moving tissue from view to view. Accordingly, the prior art collection techniques attempted to collect the views with the greatest possible position consistency from the view to view.

In one prior art technique, short TR/TE sequences were utilized with multiple averaging, i.e. each view is the average of more than one time displaced views collected with the moving tissue at different positions. This technique tended to average motion-related deviation among the views to create a pseudo-consistency from view to view. Another prior art technique utilized a multi-echo Carr-Purcell sequence in which data was collected at both first and second echoes. Differences between the first and second echo data could be attributed to blood flow and used to correct for flow related artifacts. In a third technique, cardiac or respiratory gating was utilized. That is, imaging sequences were permitted to occur only during specified portions of the respiratory and cardiac cycles. Commonly, imaging data collection was permitted only in the portions of the respiratory cycle with the least movement. For cardiac imaging, the imaging sequence was commonly synchronized with a selected phase of the cardiac cycle.

The use of short TR/TE sequences was disadvantageous in that it is limited to T1 weighted images. Further, multiple averaging increased scan times. Using the second echo of Carr-Purcell or other multi-echo sequences was only effective for rephasing material having a constant velocity. Breathing motion, surging blood flow adjacent to the heart, and the like do not have constant velocities and cannot be corrected with this technique. Further, the multi-echo technique requires a higher RF dosage than other T2 imaging techniques in order to desensitize the data to motion. With respiratory or cardiac gating, the time to collect image data is increased significantly and the image quality is degraded. Further, with cardiac gating, the rapid movement of the heart places limits on available pulse sequences—only short imaging sequences. Moreover, these prior art correction techniques were limited to correcting for blood flow and respiratory and cardiac motion. None of them were particularly effective for involuntary movement or peristalitic motion.

The present invention relates to a method and apparatus for imaging in which the image is desensitized to motion related artifacts by rephasing motion dependent components of the magnetic resonance signals.

SUMMARY OF THE INVENTION

In accordance with one aspect of the present invention, a method of generating magnetic resonance image data is provided. The present invention comprises an improvement in a conventional magnetic resonance image generating sequence which includes the application of at least a resonance excitation pulse, a slice select gradient pulse, and a read gradient pulse. One or more motion desensitization gradient pulses are applied which have components in at least one of the slice select and read gradient directions. The relative amplitudes and durations of the motion desensitization gradient pulses are selected such that the sum of a selected one or more of the zeroth through third or higher order moments in time of the gradient pulses in the selected direction between the excitation pulse and the center of read gradient pulse is a preselected value, e.g. zero. In this manner, a selected one or more of the static, constant velocity, acceleration, pulsatility and higher order components are rephased to eliminate the associated motion artifacts.

In accordance with a more limited aspect of the present invention, static, constant velocity, and acceleration related artifacts are inhibited by applying three motion desensitization gradient pulses in the selected direction and selecting the relative amplitudes and durations of the three gradient pulses such that the sums of the zeroth, first, and second moments in time in the selected direction is a preselected constant, preferably zero. Analogously, third and higher order corrections can be made analogously by adding a fourth or additional pulses and selecting the amplitudes and durations such that the zeroth through the third or higher order moments in time of the pulses in the selected direction are all zero.

In accordance with yet another more limited aspect of the present invention, motion desensitization gradient pulse components are applied along both the read and slice select gradient directions. The amplitude and duration of the pulses is selected such that the sum of each of the moments in time along the read direction is zero and the sum of each of the moments in time along the slice select direction is zero.

In accordance with another aspect of the present invention, a magnetic resonance imaging apparatus is provided. A main magnetic field control means generates a generally uniform magnetic field through an image region. A radio frequency means is provided for transmitting into the image region radio frequency pulses which are configured for at least exciting magnetic resonance of selected dipoles. A motion desensitization gradient memory means stores gradient configuration information for motion desensitization gradients to be applied in each of the slice select and read directions. The motion desensitization gradients are configured such that the sum of each of selected moments in time of the gradients applied along the read and slice select directions between the excitation pulse and data collection is zero. A gradient means selectively causes magnetic field gradients appropriate to a selected image sequence including motion desensitization gradients appropriate to the selected sequence from the motion desensitization gradient memory. The gradients across the image region in each of a slice select, read, and phase encode direction. A magnetic resonance receiving means receives collected magnetic resonance image data. An imaging means converts the received data to a representation of an image of at least a planar slice of the image region.

One advantage of the present invention is that it enables the acquisition of clinically diagnostic T2 weighted images without artifacts due to patient or organ motion and blood flow.

Another advantage of the present invention is that it reduces motion artifacts that accompany T1 weighted images.

Another advantage of the present invention is that it enables data from a region which includes tissue movement to be collected rapidly, with as few as one data acquisition sequence per view. The elimination of averaging and gating improves not only data acquisition rapidity but also the sharpness of the resultant image.

Yet another advantage of the present invention is that it minimizes RF power. Imaging sequences can be readily performed with as few as two RF pulses per sequence.

Still further advantages of the present invention will become apparent to those of ordinary skill in the art upon reading and understanding the following detailed description of the preferred embodiments.

BRIEF DESCRIPTION OF THE DRAWINGS

The present invention may take form in various steps and arrangements of steps and in various components and arrangements of components. The drawings are only for purposes of illustrating a preferred embodiment of the invention and are not to be construed as limiting it.

FIG. 1 is a diagrammatic illustration of a magnetic resonance imaging apparatus in accordance with the present invention;

DETAILED DESCRIPTION OF THE PREFERRED EMBODIMENT

Figure 3:
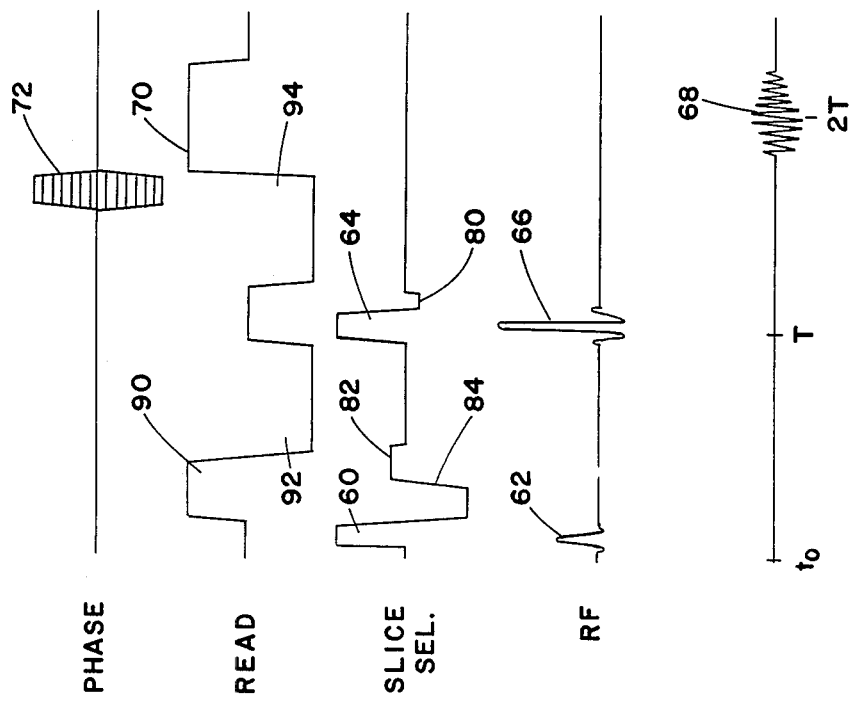
FIG. 3 illustrates a spin echo pulse sequence which provides a second order motion correction which corrects for static, velocity and acceleration-related motion defect; and, FIG. 4 illustrates a spin echo pulse sequence with a third order motion correction for correcting for static, velocity, acceleration and pulsatility-related motion artifacts.

With reference to FIG. 1, a magnetic resonance imaging apparatus includes a main magnetic field means A for generating a substantially uniform magnetic field linear through an image region. A radio frequency means B selectively transmits radio frequency excitation, inversion, and other pulses into the image region to excite and manipulate resonating dipoles therein. A gradient field means C selectively applies a gradient field preferably along three orthogonal axes, across the image region. A pulse sequence control means D controls the radio frequency and gradient means to cause the generation of preselected pulse sequences, such as the sequences illustrated in FIGS. 2-4. An image means E reconstructs received magnetic resonance signals into electronic image representations which may be displayed, stored, or the like.

The main magnetic field means A includes a plurality of magnets 10 and a control circuit 12 therefor. The control circuit causes the magnets to generate a uniform magnetic field axially therethrough, particularly in a centrally located image region.

The radio frequency means B includes a radio frequency (RF) coil 20, such as a quadrature coil which surrounds the image region. A resonance excitation control circuit or means 22 selectively applies radio frequency pulses to the RF coil 20 to excite magnetic resonance of dipoles in the image region. A typical resonance excitation pulse is a 90° pulse. An inversion pulse control circuit or means 24 selectively applies inversion pulses, such as broadband 180° pulses, for selectively inverting or flipping the spin of the resonating nuclei. Optionally, pulses of other configurations for making other selected manipulations of the spins may be generated.

The gradient control means C includes a gradient coil arrangement 30 which includes the appropriate windings for causing gradients across the main magnetic field in the image region at selectable angles. In the preferred embodiment, gradients are selectively caused along three orthogonal axes designated as the slice select, read, and phase encode axes or directions. A first axis or slice selection gradient control means or circuit 32 selectively applies electrical power to the gradient coil assembly to select one or a multiplicity of slices or planes in the image region to be phase of slices or planes in the image region to be phase mapped. Commonly the slice is selected by applying a linear field gradient across the image region and applying a narrow band excitation pulse to excite spins over a limited range of resonance frequencies. A second axes or read gradient control 34 selectively applies read gradient across the image region in the read direction. A third gradient or phase encode gradient control circuit or means 36 selectively applies phase encode gradients for spatially encoding the resonance signal. Typically each resonance excitation is coded with a different one of 256 phase encode gradients to generate each of 256 views which may be reconstructed into the image.

The pulse sequence control means D includes a pulse sequence format means 40 which formats RF and gradient pulses in a selected sequence to be applied to the radio frequency and gradient coils. More specifically, a pulse sequence selection means 42 is controlled by the operator to select from a plurality of available pulse sequences, such as a spin-echo inversion recovery, multi-echo, gradient-echo, or other conventional imaging sequence. The sequence selection means further enables the operator to select some parameters of the sequence, such as duration, number of repetitions, and the like. An imaging pulse sequence memory means 44 is preprogrammed to store a description of each of the pulses which is applied during one of the selected sequences. Specifically, for a given sequence, the imaging pulse sequence memory stores the time and description of the RF excitation pulse, the time and description of an RF inversion pulse, the on and off times and amplitude of each of the slice selection pulses, the times and amplitudes of read gradient pulses, the times and amplitudes of phase encode gradient pulses, an indication of when generated resonance signals are to be sampled, and the like.

The start and stop times and amplitude for motion desensitization pulses to be applied in each of the read and slice select directions are preferably stored in the same memory as the imaged pulse sequences as an integral part thereof. However, for greater flexibility in selecting the motion desensitization, a motion desensitization correction pulse memory means 46 may be provided. A motion desensitization selection means 48 enables the operator to select whether or not a motion desensitization is to be made and, if so, the order of the correction.

In the preferred embodiment, the operator can select a zeroth, first, second, or third order motion desensitization. To make a zeroth order desensitization, i.e. rephase static material, one or more motion desensitization gradient pulses are added in each of the read and slice select gradient directions. The static or zeroth order desensitization pulses are appropriately scaled in duration and amplitude such that the sum of the zeroth moments in time of the gradient pulses along each of the read and slice select directions is zero.

When a first order correction is selected, one or more motion desensitization gradient pulses are added to the pulse sequence such that the sum of the first moments in time along each of the slice select and read gradients directions are zero. Generally, the sum of both the zeroth and first moments are set to zero to correct for both static rephasing and constant velocity artifacts.

When a second order desensitization is selected, additional gradient pulses are added such that the sum of the second moments in time of the gradients along each of the read and slice select directions is also zero. In this manner, correction is made for static components, constant velocity components, and acceleration. Again, in some applications it will be advantageous to set only one or two orders of moments to zero and set the other to a non-zero value, i.e. desensitize only one or two of the constant velocity and acceleration related artifacts.

Figure 4:
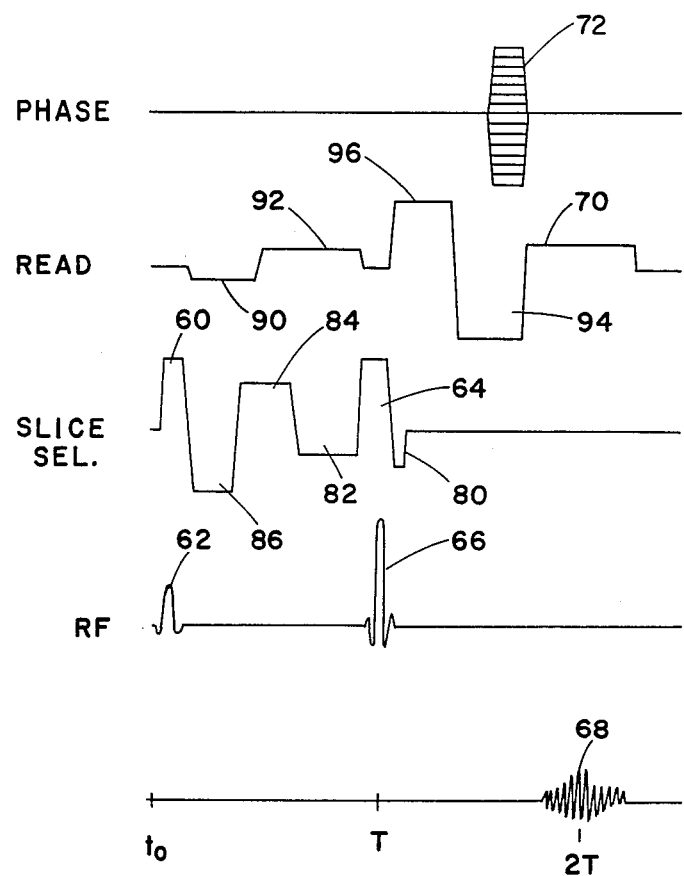

To correct for pulsatility related artifacts, a third order correction or desensitization is selected. In a third order correction, sufficient gradient pulses are added such that the sums of the zeroth, first, second, and third moments set equal to zero. Analogously, fourth and higher order corrections may be made. Exemplarly first, second, third order correction pulse sequences are illustrated in FIGS. 2–4 respectively.

At the end of each applied pulse sequence, conventionally during a read gradient pulse, a radio frequency receiver 50 is gated to receive the magnetic resonance signal generated by the resonating nuclei. The receiver may be connected with the RF coil 20, as illustrated, or may be connected with a dedicated receive only coil. A conventional image reconstruction means 52, such as an algorithm for performing a two dimensional Fourier transform, transforms the received signal into an image representation. The signal from each pulse sequence forms one view of the image which is stored in an image memory 54. Subsequent views from subsequent pulse sequences with a different phase encode gradient are stored in the image memory to build the electronic image representation. A video monitor or other display means 56 converts the electronic image representation into a man-readable image. Optionally, the image representation may be stored in a storage means 58, such as a tape, disc, or the like.

Figure 2:
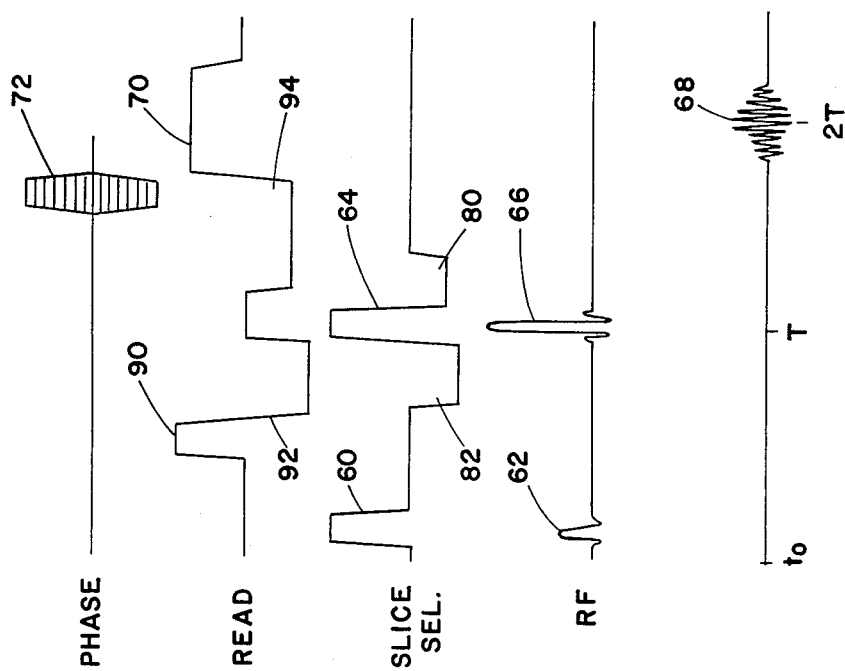
FIG. 2 illustrates a spin echo pulse sequence with a first order motion correction for correcting for static and constant velocity related artifacts.

With particular reference to FIG. 2, at the beginning of a first order corrected spin echo imaging sequence designated as time t0, the slice select gradient control means 32 causes a slice select gradient 60 to be applied. Concurrently, the resonance excitation control means 22 causes a 90° radio frequency excitation pulse 62 to be applied. At a predetermined time T after the slice select gradient pulse 60 is shut off, the slice select gradient control means 32 and the inversion pulse control means 24 concurrently causes a slice select gradient 64 and a 180° radio frequency inversion pulse 66 to be applied. The inversion pulse causes dephasing magnetic resonance spins to commence rephasing resulting in a spin echo 68 at a time 2T. The read gradient control means 34 causes a read gradient 70 currently with the spin echo and of a sufficient duration to span the portions of the echo during which data is collected. Between the second slice select pulse 64 and the read gradient pulse 70, the phase encode gradient control means 36 causes a phase encode gradient pulse 72 to be applied.

The instructions retrieved from the motion desensitization gradient pulse memory 46 cause additional motion desensitization gradients 80 and 82 to be caused in the slice select direction. The magnitudes and duration of the slice selection motion desensitization pulses 80, 82 are selected such that the zeroth moment in time of the gradient pulse components in the slice select direction between t0 and 2T are set equal to zero, i.e.:

$$\phi_1 = \int_{t_0}^{2T} \gamma G(t) X dt = 0, \qquad (1)$$

where $\phi$ is the phase of the material at time t, $\gamma$ is the gyromagnetic ratio, G(t) is the gradient at time t and X is the position of the material at time t. That is, the area under slice select gradient pulses 60, 64 is equal the area of motion desensitizing gradient pulses 80 and 82. Meeting this constraint performs a zeroth order correction for static rephasing.

To correct for velocity related artifacts, the first moment in time is also set equal to zero, i.e.

$$\phi_2 = \int_{t_0}^{2T} \gamma G(t) v t dt = 0, \qquad (2)$$

where v is the velocity of the material at time t. That is, the first derivatives of the gradients in the slice select direction sum to zero.

The motion desensitization pulses may be applied anywhere between the first and second slice select pulses 60 and 64 and between the second slice select pulse 64 ad the read gradient 70. Within these constraints, it is to be appreciated that the various combinations of amplitude and duration of the slice select direction desensitization gradient pulses may be selected. One technique is to select the start and stop times of the motion correction pulses arbitrarily and calculate the appropriate amplitudes of each required for Equations (1) and (2) to be set equal to zero. If the calculated amplitudes are inappropriate to the equipment or the imaging sequence, other start and stop times for the motion correction gradient pulses may be selected and the amplitudes recalculated.

Analogously, motion desensitization gradient pulses 90, 92 and 94 are applied in the read direction. The motion desensitization gradient pulses in the read direction are again selected such that the zeroth moment in time and the first moment in time are again set equal to zero. The read direction motion correction gradients again are applied between the first slice select pulse 60 and the second slice select pulse 64 and between the second slice select pulse 64 and the read gradient pulse 70.

With reference to FIG. 3, corrections can be made for static rephasing; velocity and acceleration related artifacts. Looking at the same spin echo sequence as in FIG. 2, motion desensitization pulses 80, 82, and 84 are added in the slice selection direction such that not only Equations (1) and (2) are met, but also, the second moment in time is set equal to zero, i.e.:

$$\phi_3 = \int_{t_o}^{2T} \gamma G(t) \frac{at^2}{2!} dt = 0, \tag{3}$$

where a is the acceleration of the material at time t. Analogously, the motion desensitization pulses 90, 92, and 94 in the read direction are selected such that Equations (1), (2), and (3) are all met. In this manner, magnetic resonance signal components attributable to static, constant velocity, and accelerating tissue are rephased. The rephasing of moving tissue eliminates its contribution to the image data and eliminates the motion related artifacts.

With reference to FIG. 4, a third order motion correction may also be provided to correct for static rephasing, constant velocity, accleration, and pulsatility related artifacts. FIG. 4 illustrates the same pulse echo imaging sequences as FIGS. 2 and 3, but with motion desensitization gradient pulses added which correct for the zeroth through third moment in time related motion artifacts. Desensitization gradient pulses 80, 82, 84, and 86 in the slice select direction are configured with appropriate duration and amplitude such that Equations (1), (2), and (3) are satisfied as well as Equation (4):

$$\phi_4 = \int_{t_o}^{2T} \gamma G(t) \frac{pt^3}{3!} dt = 0, \tag{4}$$

where p is the pulsatility of the material at time t. Analogously, read direction motion desensitization gradient pulses 90, 92, 94, and 96 are applied such that Equations (1), (2), (3), and (4) are all met along the read direction.

In the preferred embodiment, four motion desensitization gradient pulses are added in each of the slice select and read gradient directions in order to simplify these selection. For gradients having preselected start and stop times, only the amplitude of the desensitization gradients need be determined to satisfy Equations (1) through (4), i.e. four unknown amplitude quantities. The contributions from the other slice select and read gradients are known. Thus, with four equations, Equations (1) through (4), and four unknown gradient amplitudes, the appropriate gradient amplitude to meet the conditions of Equations (1) through (4) may be readily calculated or otherwise selected. It is to be appreciated, however, that the conditions of Equations (1) through (4) could also be met with a larger number of gradient pulses.

It is to be appreciated that setting the phase terms to zero, as done in Equations (1) through (4), results in the complete rephasing of static through pulsatile material in the imaged slice. In some instances, it may be desired to include the material which is undergoing one or more of constant velocity, acceleration, or pulsatility in one or more of the read and slice select directions. Such material can be included by setting the corresponding equation, Equation (2) for velocity, Equation (3) for acceleration, and Equation (4) for pulsatility to a non-zero constant. The magnitude of the constant may be selected to determine the relative signal strength between the tissue moving in the selected manner in the non-moving imaged tissue.

Looking more specifically to the calculation of the appropriate characteristics for the motion desensitization gradient pulses, the phase of a material subject to varying gradients is described generically as:

$$\phi = \int_0^t \gamma G(t) X(t) dt, \tag{5}$$

where x(t) is the position of the moving material at time t. Expanding the x(t) term in a power or Taylor series, the position can be expressed as:

$$X(t) = \sum_{j=0}^{\infty} \frac{t^j x_o^{(j)}}{j!}, \tag{6}$$

where x is the jth differential of x at time zero. In the embodiment of FIG. 2, the first two terms of the Taylor series are integrated separately using Equation 5 and set to zero; in the embodiment of FIG. 3, the first three terms of the Taylor series are utilized; in the embodiment of FIG. 4, the first four terms of the Taylor series are utilized. Optionally, higher order terms may also be utilized. In the preferred embodiment, a matrix format is utilized to select the desensitization gradient pulse amplitudes, i.e.:

$$\{(t)\}\{G\} = \{\phi/X^j\gamma\} - \{\Sigma G^k\} \tag{7}$$

where:

$$\{t^j\} = \begin{bmatrix} (t_2 - t_1) & (t_4 - t_3) & \ldots & (t_j - t_{j+1}) \\ (t_2^2 - t_1^2) & \cdots & \cdots & (t_j^2 - t_{j+1}^2) \\ \vdots & & & \vdots \\ (t_2^j - t_1^j) & \cdots & \cdots & (t_j^j - t_{j+1}^j) \end{bmatrix} \tag{7a}$$

$$\{G\} = \begin{bmatrix} G_1 \\ G_2 \\ \vdots \\ G_j \end{bmatrix} \tag{7b}$$

$$\{\phi/x^j\gamma\} = \begin{bmatrix} \dfrac{\phi}{x\gamma} \\ \dfrac{\phi}{x\gamma} \\ \vdots \\ \dfrac{\phi}{x^j\gamma} \end{bmatrix} \quad (7c)$$

$$\{\Sigma G^k\} = \begin{bmatrix} \Sigma G^k(t_E - t_B) \\ \Sigma G^k(t_E{}^2 - t_B{}^2) \\ \vdots \\ \Sigma G^k(t_E{}^j - t_B{}^j) \end{bmatrix} \quad (7d)$$

The matrix $\{\Sigma G^k\}$ represents the summation of the integral of the known gradients $G^k$, such as the first and second slice select gradients 60 and 64 and the read gradient 70, taken between their initial or starting time $t_b$ and their ending times or final times $t_e$. The matrix $\{\phi/x^{(j)}\gamma\}$ represents the phase, $\phi$, of the unknown gradient divided by the order of the expansion and the gyromagnetic ratios. The matrix [G] represents the unknown gradient amplitudes which are to be calculated. The matrix $\{t^j\}$ contains all the integral terms of the specified times at which the unknown gradients begin and end.

Thus, for a zeroth through third order correction, a 4×4 matrix is solved for the four unknowns in each of the read and slice select directions becomes the equivalent to Equations (1) through (4) with all terms being known or specified, except the amplitude of four read or slice select axis motion desensitizing gradient pulses. With four unknowns in four equations, one can readily solve for the amplitudes.

In a conventional implementation, the motion desensitizing gradient pulses have trapezoidal profiles, rather than the rectangular profiles assumed by the above referenced equations. This leads to errors in the phase term $\phi$, particularly in the higher order corrections. In the preferred embodiment, the rise and fall portions of the trapezoid are approximated as a series of contiguous short duration rectangular pulses of increasing amplitude on the rise side and decreasing amplitude on the fall side. With this approximation, the phase term $\phi$ becomes:

$$\phi = \sum_{i=1}^{\eta_r} \int_{t_1 + (i-1)\frac{tr}{\eta R}}^{t_1 + \frac{itr}{\eta r}} \gamma G_R(t)X(t)dt + \quad (8)$$

$$\int_{t_1 + tr}^{t_2 - tf} \gamma G(t)X(t)dt + \sum_{i=\eta_f-1}^{0} \int_{t_2 - \frac{(i-1)tf}{\eta f}}^{t_2 - \frac{itf}{\eta f}} \gamma G_f(t)X(t)dt$$

where $n_r$ is the number of rectangular pulses in the approximation of the rising slope portion of the trapezoid, $n_f$ is the number of rectangular pulses in the approximation of the falling slope portion of the trapezoid, t1 is the starting time of the trapezoid, t1+tr is the end of the rising portion of the trapezoid and the beginning of the plateau portion, t2−tf is the end of the plateau portion and the beginning of the falling slope portion, t2 is the end of the pulse, tr is the total duration of the rising portion of the trapezoid, and tf is the duration of the falling portion of the trapezoid. In Equation (8), it will be appreciated that the first term is the sum of the intervals over each of the individual rectangular pulses that approximate the rise portion of the trapezoid. The second term is an integration over the rectangular pulse which forms the plateau or center portion of the trapezoid. The last term is the sum of the integrations over each of the rectangular pulses that approximate the falling portion of the trapezoid.

The invention has been described with reference to the preferred embodiments. Obviously, modifications and alterations will occur to others upon reading and understanding the preceding specification. It is intended that the invention be construed as including all such alterations and modifications insofar as they come within the scope of the appended claims or the equivalents thereof.

Having thus described the preferred embodiments, the invention is now claimed to be:

1. In a magnetic resonance image generating sequence, which includes at least the application of a radio frequency resonance excitation pulse, a slice select gradient pulse, and a read gradient pulse, the improvement comprising:
   in the direction of at least one of the slice select and read gradients, applying a plurality of motion desensitization gradient pulses between the resonance excitation pulse and the read gradient pulse, the amplitude and duration of each of the plurality of motion desensitization pulses being selected such that the sum of at least two of the zeroth, second, and third moments in time of the phase of the gradient pulses along the selected one of the slice select and read gradient directions are set equal to preselected values.

2. The method as set forth in claim 1 wherein the preselected value is zero.

3. The method as set forth in claim 1 wherein moments of order greater than three are also set equal to zero.

4. The method as set forth in claim 1 wherein the image generating sequence includes one of a spin echo, an inversion recovery, a multi-echo, and a gradient echo imaging sequence.

5. In a magnetic resonance image generating sequence, which includes at least the application of a radio frequency resonance excitation pulse, a slice select gradient pulse, and a read gradient pulse, the improvement comprising:
   applying at least four motion desensitization gradient pulses between the resonance excitation pulse and the read gradient pulse, the four motion desensitization gradient pulses being applied in a selected one of the read and slice select gradient directions, the amplitude and duration of the motion desensitization pulses being selected such that the sum of each of the zeroth, first, second, and third moments in time of the phase of the gradient pulses along the selected one of the slice select and read gradient directions is set equal to zero.

6. The method as set forth in claim 5 wherein the motion desensitization gradient pulses are applied in both the read and the slice select gradient directions.

7. In a magnetic resonance image generating sequence, which includes at least the application of a radio frequency resonance excitation pulse, a slice select gradient pulse, and a read gradient pulse, the improvement comprising:

in the direction of at least one of the slice select and read gradients, applying at least one motion desensitization gradient pulse between the resonance excitation pulse and the read gradient pulse, the amplitude and duration of the motion desensitization pulse being selected such that the sum of at least one of the zeroth, first, second, and third moment in time of the phase of the gradient pulses along the selected one of the slice select and read gradient directions is set equal to a preselected value;

determining the appropriate duration and amplitudes of the motion desensitization gradient pulses, the amplitude and duration determining steps including:

selecting beginning and ending times for each gradient pulse, the number of motion desensitization gradient pulses being the same as the number of moments which are to be set to preselected values;

along each of the slice select and read directions, setting the corresponding each term of the power series expansion:

$$\sum_j \int^t rG(t) \frac{x_0^{(j)} t^j}{j!} dt$$

to one of the preselected values and solving for the amplitudes of the motion desensitization gradients, $\gamma$ is the gyromagnetic ratio, G(t) is the gradient at time t, and $x_0^{(j)}$ is the jth differential of position x at time 0.

8. The method as set forth in claim 7 wherein a matrix format is utilized to solve for the amplitudes of the motion desensitization gradient pulses.

9. In a magnetic resonance image generating sequence, which includes at least the application of a radio frequency resonance excitation pulse, a slice select gradient pulse, and a read gradient pulse, the improvement comprising:

in the direction of at least one of the slice select and read gradients, applying at least one motion desensitization gradient pulse between the resonance excitation pulse and the read gradient pulse, each motion desensitization gradient pulse being generally trapezoidal in cross section having a rising leading portion, a central plateau portion, and a falling trailing end portion and wherein the rising portion and the falling portions are approximated by a series of rectangular pulses, the amplitude and duration of the motion desensitization pulses including the series of rising and falling portions approximately rectangular pulses being selected such that the sum of at least one of the zeroth, first, second, and third moments in time of the phase of the gradient pulses along the selected one of the slice select and read gradient directions is set equal to a preselected value.

10. A method of generating magnetic resonance image representations, the method comprising:

generating a generally uniform magnetic field through an image region in which a subject to be imaged is positioned;

applying a plurality of pulse sequences to the image region, each pulse sequence including the concurrent application of a first slice select gradient in a slice select direction and a resonance excitation RF pulse, the concurrent application of a second slice select gradient pulse and an RF inversion pulse to invert the spin magnetization of resonating nuclei, application of a read gradient pulse in a read direction concurrently with a spin echo, and application of a phase encode gradient pulse prior to the read gradient;

the pulse sequence further including the application of a plurality of motion desensitization gradient pulses having components in the slice select and read gradient directions, the motion desensitization pulses having a duration and amplitude such that the sum of at least one of the zeroth, first, second, and third moments in time of the phase along each of the slice select and read gradient directions is a preselected value.

11. The method as set forth in claim 10 wherein the sum of the zeroth moments in each of the slice select and read gradients are zero whereby static material is rephased.

12. The method as set forth in claim 10 wherein the sum of the first moments in each of the slice select and read gradient directions are zero such that magnetic resonance signals from portions of the subject moving at a constant velocity are rephased.

13. The method as set forth in claim 10 wherein the sum of the second moments along each of the slice select and read gradient directions are zero such that magnetic resonance signals from accelerating portions of the subject are rephased.

14. The method as set forth in claim 10 wherein the sum of the third moments along each of the slice select and read gradient directions are zero such that magnetic resonance signals from portions of the subject moving with a pulsatile motion are rephased.

15. An apparatus for generating motion desensitized magnetic resonance images, the apparatus comprising:

main magnetic field means for generating a generally uniform magnetic field through an image region;

a radio frequency pulse means for selectively applying radio frequency pulses to the image region, at least some of the radio frequency pulses being configured for exciting magnetic resonance of selected dipoles in the image region;

a slice selection gradient control means for selectively applying magnetic field gradient pulse in a slice select direction across the image region;

read gradient control means for selectively applying magnetic field gradient pulses across the image region in a read direction;

a phase encode gradient control means for selectively applying magnetic field gradients in a phase encode direction across the image region;

an imaging pulse sequence and motion desensitization memory means for storing amplitude and relative timing information for each of a plurality of selectable imaging sequences including RF, slice select gradient, read gradient, and phase encode gradient pulses, and motion desensitization magnetic field gradient pulses to be applied in each of the slice select and read gradient directions;

a pulse sequence format means operatively connected with the imaging pulse sequence and motion desensitization pulse memory means and with the radio frequency pulse means, the slice select gradient control means, the read gradient control means, the phase encode gradient control means for causing the radio frequency pulse control means, the slice select gradient control means, the read gradient control means, and the phase encode gradient control means to apply the selected sequence of imaging and motion desensitization pulses to the image region;

a radio frequency receiving means for receiving radio frequency magnetic resonance signals from the image region; and, image reconstruction means for forming an image representation from the received magnetic resonance signals.

16. The apparatus as set forth in claim 15 wherein the motion desensitization gradient pulse amplitude and timing information is selected such that the sum of at least the zeroth, first, second, and third moments in time of the phase along each of the slice select and read gradient directions are selectively setable to a preselected value; and, a motion desensitization control means operatively connected with the pulse sequence and motion desensitization pulse memory means for selecting which sums are set equal to the preselected value.

* * * * *